United States Patent
Ogawa et al.

(10) Patent No.: US 9,817,035 B2
(45) Date of Patent: Nov. 14, 2017

(54) IMPEDANCE MEASURING CIRCUIT

(71) Applicant: Kabushiki Kaisha Toshiba, Minato-ku, Tokyo (JP)

(72) Inventors: Yosuke Ogawa, Yokohama Kanagawa (JP); Shigeo Imai, Chiba Chiba (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 66 days.

(21) Appl. No.: 15/065,388

(22) Filed: Mar. 9, 2016

(65) Prior Publication Data

US 2017/0097377 A1    Apr. 6, 2017

(30) Foreign Application Priority Data

Oct. 5, 2015  (JP) .................................. 2015-197884

(51) Int. Cl.
  *G01R 15/06*  (2006.01)
(52) U.S. Cl.
  CPC .................................... *G01R 15/06* (2013.01)
(58) Field of Classification Search
  CPC ........ G01R 27/02; A61B 5/053; A61B 5/0537
  See application file for complete search history.

(56) References Cited

U.S. PATENT DOCUMENTS

| 5,151,939 A * | 9/1992 | Marrah ................. H04H 20/49 381/15 |
| 7,391,257 B1 * | 6/2008 | Denison ............... A61B 5/0002 330/10 |
| 8,934,966 B2 * | 1/2015 | Osawa ..................... A61B 5/04 600/547 |
| 2011/0208028 A1 * | 8/2011 | Rossi ................... A61B 5/0537 600/372 |
| 2013/0238048 A1 | 9/2013 | Almendinger et al. |

FOREIGN PATENT DOCUMENTS

| JP | 2000-065878 A | 3/2000 |
| JP | 2013-128716 A | 7/2013 |

\* cited by examiner

*Primary Examiner* — Clayton E Laballe
*Assistant Examiner* — Noam Reisner
(74) *Attorney, Agent, or Firm* — White & Case LLP

(57) ABSTRACT

An impedance measuring circuit has an amplifier connected to a target and to amplify an input AC voltage with a gain corresponding to an impedance in the target and to output the voltage, and a voltage level setting circuit to set a DC voltage level in an output node of the amplifier when a first capacitor is connected between one end of the target and an output node of the amplifier and a second capacitor is connected between another end of the target and a node with a voltage correlated with the input AC voltage.

12 Claims, 4 Drawing Sheets

IMPEDANCE MEASURING CIRCUIT

CROSS REFERENCE TO RELATED APPLICATIONS

This application is based upon and claims the benefit of priority from the prior Japanese Patent Application No. 2015-197884, filed on Oct. 5, 2015, the entire contents of which are incorporated herein by reference.

FIELD

An embodiment of the present invention relates to an impedance measuring circuit.

BACKGROUND

Impedance measuring circuits are known. In the impedance measuring circuits, input signals such as AC signals are input to a target such as a living body, and an impedance in the target is measured based on a magnitude of the input signal reflected or transmitted by the target.

When the target is a human body, the Pharmaceutical Affairs Law limits a current that can be supplied to a human body.

Therefore, impedance measuring circuits of the related art include a protective resistor such that a current larger than or equal to a limited value is prevented from flowing in a human body.

However, a protective resistor results in a smaller voltage amplitude of the input signal reflected or transmitted by the target, and thus it is desirable that a gain of an amplifier for amplifying the input signal is high. Since the input signal includes a noise component, a high gain of the amplifier may cause a signal component of the original target to be buried in the noise component and thus accurately measuring an impedance in the target may become difficult.

Therefore, instead of the protective resistor, a capacitor may be connected in series to the impedance in the target, thereby removing a DC voltage component that includes a noise component and detecting an AC signal component. However, the capacitor connected in series to the impedance in the target may hinder determination of a DC point of the aforementioned amplifier, thereby hindering correct measurement of the impedance in the target.

DETAILED DESCRIPTION

According to one embodiment, an impedance measuring circuit has an amplifier connected to a target and to amplify an input AC voltage with a gain corresponding to an impedance in the target and to output the voltage, and a voltage level setting circuit to set a DC voltage level in an output node of the amplifier when a first capacitor is connected between one end of the target and an output node of the amplifier and a second capacitor is connected between another end of the target and a node with a voltage correlated with the input AC voltage.

An embodiment of the present invention will be described below with reference to the drawings.

First Embodiment

Figure 1:
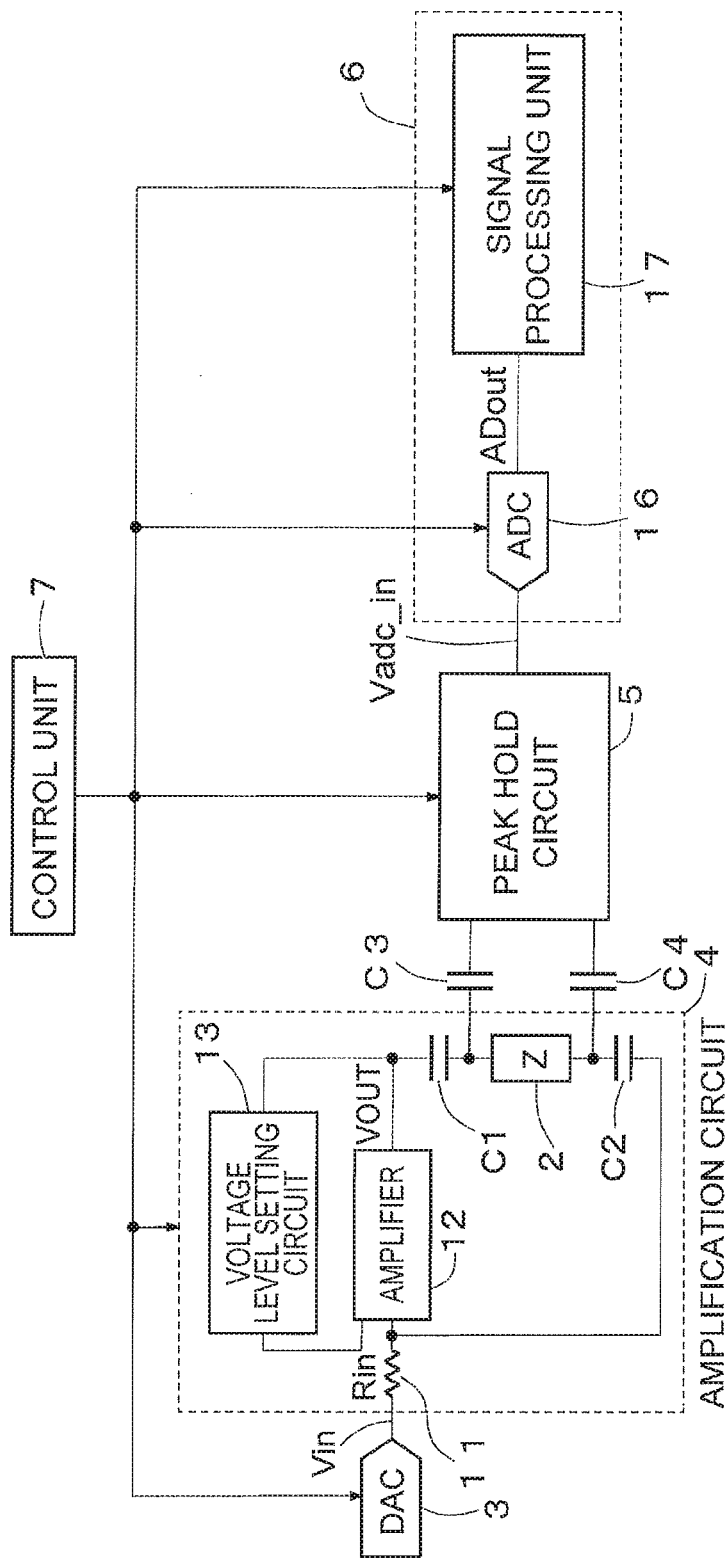
FIG. 1 is a block diagram illustrating a schematic configuration of an impedance measuring circuit according to a first embodiment.

FIG. 1 is a block diagram illustrating a schematic configuration of an impedance measuring circuit 1 according to a first embodiment. The impedance measuring circuit 1 in FIG. 1 measures an impedance Z in a target 2 such as a living body. The target 2 may be a living body, such as a human body or an animal, or any other object. Hereinafter, an example where the target 2 is a human body will be mainly described.

The impedance measuring circuit 1 in FIG. 1 includes a DA converter (DAC) 3, an amplification circuit 4, a peak hold circuit 5, an impedance calculation circuit 6, and a control unit 7. At least a part of the impedance measuring circuit 1 may be incorporated in one or more semiconductor integrated circuits.

The DA converter 3 performs DA conversion with a digital signal and generates a predetermined input voltage Vin. The input voltage Vin is, for example, an AC signal (input AC voltage) having a predetermined amplitude. A frequency of the AC signal is not specifically limited and may be, for example, 5 kHz to 200 kHz. A signal generating circuit other than the DA converter 3 may be used as long as the circuit can generate the input voltage Vin.

A reason for including the DA converter 3 is because an optimum frequency of the input voltage Vin for measuring the impedance Z is different depending on the target 2. Moreover, in order to measure body fat of a living body, it is desirable to switch the frequency of the input voltage Vin among multiple patterns along the way and to measure the impedance Z at each of the frequencies. Changing the frequency of the input voltage Vin can be easily performed by changing digital code information to be given to the DA converter 3. In this manner, including the DA converter 3 allows for adjusting the frequency of the input voltage Vin as appropriate in an easy and speedy manner.

When the target 2 is a human body, the Pharmaceutical Affairs Law is applied where a current that can be supplied to the target 2 is limited. According to the Pharmaceutical Affairs Law, only a DC current of less than 10 µA and an AC current of less than 100 µA can be supplied in a normal state. Moreover, only a DC current of less than 50 µA and an AC current of less than 500 µA can be supplied in a failure state.

In the present embodiment, capacitors are connected in series to both ends of the target 2 in order to comply with the Pharmaceutical Affairs Law. More specifically, a first capacitor C1 is connected between an output node of the amplification circuit 4 and one end of the target 2 while a second capacitor C2 is connected between a node with a voltage correlated with the input voltage Vin and another end of the target 2. The first capacitor C1 and second capacitor C2 connected to the target 2 in series increase an output amplitude from the amplification circuit 4 as compared to the case where the protective resistor is connected in series to the target 2, thereby accurately measuring the impedance Z in the target 2. The first capacitor C1 and second capacitor C2 mainly have a function to limit a DC current upon failure.

Furthermore, a third capacitor C3 is connected between one end of the impedance Z in the target 2 and the peak hold circuit 5 while a fourth capacitor C4 is connected between another end of the impedance Z in the target 2 and the peak hold circuit 5. The third capacitor C3 and fourth capacitor C4 have a function to prevent a DC current from the peak hold circuit 5 from flowing in the impedance Z in the target 2.

The amplification circuit 4 amplifies the input voltage Vin with a gain corresponding to the impedance Z in the target 2 and outputs the output voltage Vout. The amplification circuit 4 includes a first resistor 11, an amplifier 12, and a voltage level setting circuit 13. The output node of the amplification circuit 4 is connected to the one end of the first capacitor C1.

The amplifier 12 amplifies the input voltage Vin with a gain corresponding to the impedance Z in the target 2 and outputs the voltage. An internal configuration of the amplifier 12 is not specifically limited. The amplifier 12 is input with an output voltage from the voltage level setting circuit 13.

One end of the first resistor 11 is supplied with the input voltage Vin from the DA converter 3 and another end of the first resistor 11 is connected to an input terminal of the amplifier 12. The voltage level setting circuit 13 sets a DC voltage level of the output node of the amplifier 12. More specifically, the voltage level setting circuit 13 feeds back the output voltage from the amplifier 12 to an input side of the amplification circuit 4, thereby setting the DC voltage level of the output node of the amplifier 12 in order to prevent the DC voltage level of the output node of the amplifier 12 from becoming unstable.

The input voltage Vin is input to the amplifier 12 via the first resistor 11 and thus a gain is adjusted. The output voltage Vout from the amplifier 12 is supplied to the other end side of the impedance Z in the target 2. Therefore, an electric current I corresponding to the output voltage Vout flows in the impedance Z in the target 2.

The impedance Z in the target 2 can be expressed as $|Z|=|Vout|/|I|$.

When a resistance value of the first resistor 11 is defined as Rin, $|I|=|Vin|/Rin$ holds, where a value $|Vin|$ is known. Therefore, a value $|I|$ is also known. Thus, by measuring an amplitude of the output voltage Vout, it is possible to calculate the impedance Z. An amplitude of the output voltage Vout is measured by a configuration below. Incidentally, for example, an amplitude of the input voltage Vin and the resistance value R may be set such that the electric current I is lower than 100 µA.

The peak hold circuit 5 holds a peak value of the output voltage Vout and outputs the hold value Vadc_in. A peak value is a maximum value or a minimum value of the output voltage Vout. An example will be described below where a maximum value is held; however, a case where a minimum value is held can also be configured in a similar manner.

The impedance calculation circuit 6 calculates the impedance Z in the target 2 based on the hold value Vadc_in held in the peak hold circuit 5, the amplitude of the input voltage Vin, and the resistance value R. The impedance calculation circuit 6 includes an AD converter (ADC) 16 and a signal processing unit 17.

The AD converter 16 converts the hold value Vadc_in of the peak hold circuit 5 into a digital signal ADout when an AD conversion signal is given from the control unit 7, The AD converter 16 may be, for example, a ΔΣ AD converter with a relatively high resolution and relatively slow AD conversion. The AD converter 16 can measure a very small change in amplitude of, for example, less than 100 µV. This allows for measuring, for example, a change of 1 Ω or less in the impedance Z even when amplitudes of the input voltage Vin and electric current I are relatively small.

A frequency of the input voltage Vin, which is an AC signal, is higher than a frequency that the AD converter 16 can perform AD conversion with. Therefore, the AD converter 16 cannot directly perform AD conversion with the output voltage Vout. Thus, in the present embodiment, the hold value Vadc_in is converted into the digital signal ADout.

The signal processing unit 17 performs digital signal processing and thereby calculates the impedance Z based on the known electric current I and the digital signal ADout.

In this manner, in the first embodiment, the first capacitor C1 and second capacitor C2 are connected in series to the both ends of the impedance Z in order to accurately measure the impedance Z in the target 2. In this state, the impedance Z is measured while a voltage Vout applied to the one end of the impedance Z is caused to vary according to the impedance Z and a current flowing in the impedance Z is caused to be constant. Here, the voltage level setting circuit 13 is included in order to prevent the DC voltage level of the output node of the amplifier 12 which outputs the voltage Vout from becoming unstable. The voltage level setting circuit 13 feeds back the output voltage from the amplifier 12 to the input side of the amplifier 12, thereby setting the DC voltage level of the output node of the amplifier 12.

As a result, even when the first capacitor C1 and second capacitor C2 are connected in series to the both ends of the impedance Z of the target 2 and thereby a DC signal component is removed, the DC voltage level of the output node of the amplifier 12 that generates the voltage Vout from the one end of the impedance Z does not become unstable. Therefore, even a small impedance Z of the target 2 can be accurately measured.

Second Embodiment

A second embodiment described below implements the amplification circuit 4 of the first embodiment.

Figure 2:
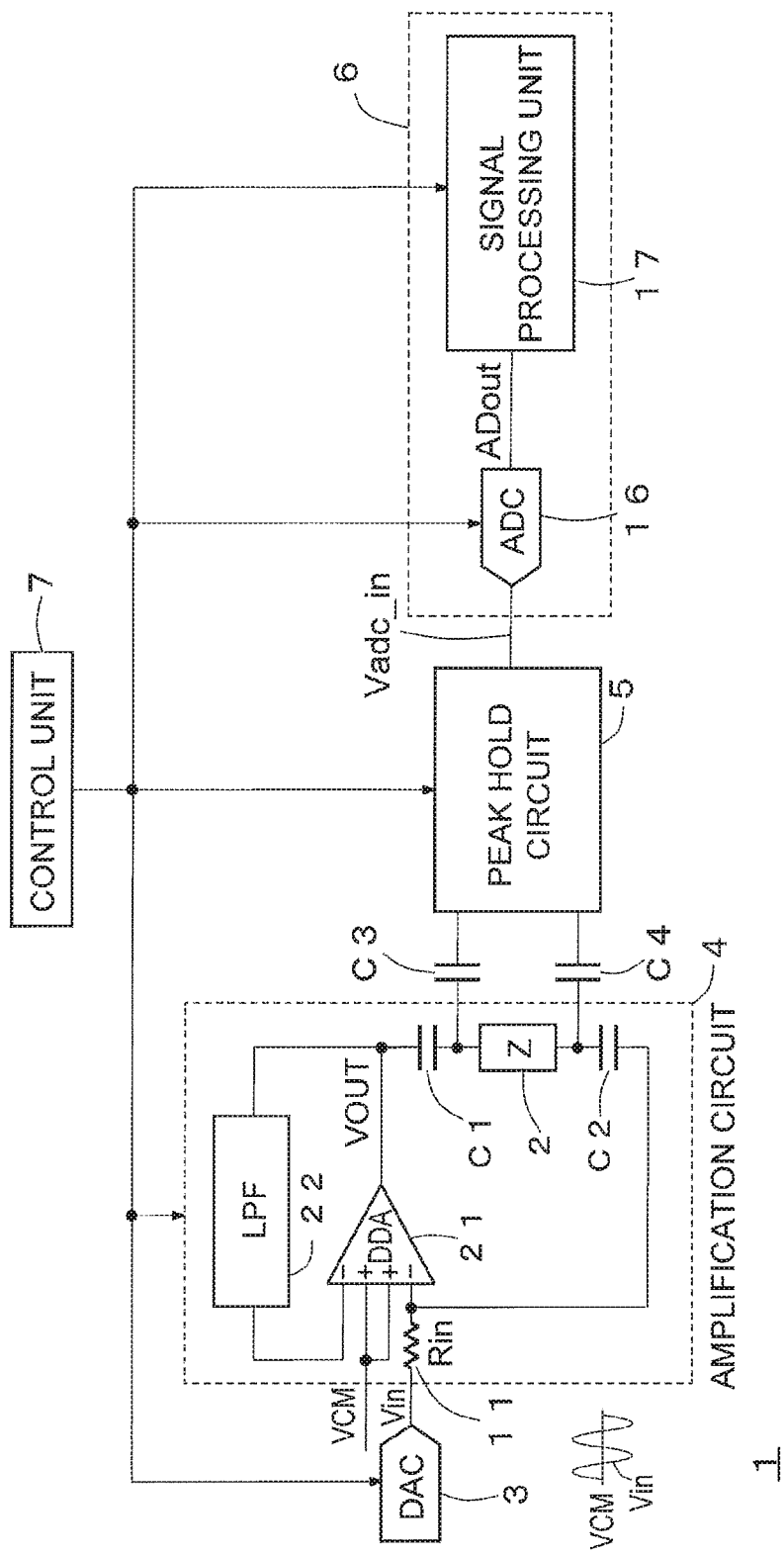
FIG. 2 is a block diagram illustrating a schematic configuration of an impedance measuring circuit according to a second embodiment.

FIG. 2 is a block diagram illustrating a schematic configuration of an impedance measuring circuit 1 according to a second embodiment. The impedance measuring circuit 1 in FIG. 2 is the same as that in FIG. 1 except for that a configuration in an amplification circuit 4 is different. The different points from FIG. 1 will be mainly described below.

The amplification circuit 4 in FIG. 2 includes a differential difference amplifier (DDA) (21) as a concrete example of the amplifier 12 in FIG. 1 and includes a low pass filter (LPF) 22 as a concrete example of the voltage level setting circuit 13 in FIG. 1.

Figure 3:
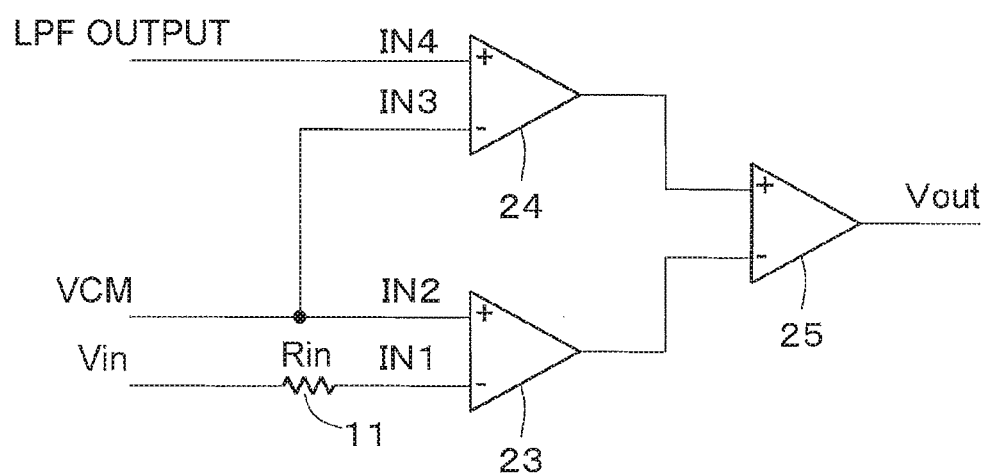
FIG. 3 is a block diagram illustrating an internal configuration of a DDA.

The DDA 21 includes four input terminals IN1 to IN4 as illustrated in FIG. 3 in detail. The input terminal IN1 is applied with an input voltage Vin via a first resistor 11. The input terminals IN2 and IN3 are applied with a reference voltage VCM which is a DC voltage level of the input voltage Vin. The input terminal IN4 is applied with an output voltage from the low pass filter 22.

The low pass filter 22 is connected between an output terminal of the DDA 21 and the input terminal IN4 of the DDA 21. The low pass filter 22 removes a frequency component of a predetermined frequency or more included in an output voltage Vout from the DDA 21. The predetermined frequency is a frequency lower than or equal to a frequency of the input voltage Vin.

The DDA 21 equivalently includes a first differential amplification circuit 23, a second differential amplification circuit 24, and a third differential amplification circuit 25 as illustrated in FIG. 3. The first differential amplification circuit 23 outputs a voltage corresponding to a voltage difference between the reference voltage VCM and input voltage Vin. The second differential amplification circuit 24 outputs a voltage corresponding to a voltage difference between an output voltage from the low pass filter 22 and the reference voltage VCM which is the DC voltage level of the input voltage Vin. The third differential amplification circuit 25 outputs a voltage corresponding to a voltage difference between the output voltage from the first differential amplification circuit 23 and the output voltage from the second differential amplification circuit 24. The output voltage Vout from the third differential amplification circuit 25 is output from an output node of the amplification circuit 4.

Therefore, it is possible to control a DC voltage level (common voltage) of the output voltage Vout from the DDA 21 to match with the reference voltage VCM. If the low pass filter 22 is not included, an AC voltage component included in the output voltage Vout from the DDA 21 is subjected to feedback to the input side of the DDA 21, which results in varying voltage levels of the reference voltage VCM. A frequency of an AC voltage component included in the output voltage Vout from the DDA 21 is substantially equivalent to a frequency component of the input voltage Vin. Therefore, if a cutoff frequency of the low pass filter 22 is set to be lower than the frequency of the input voltage Vin, the output voltage from the low pass filter 22 hardly varies, thereby suppressing variations of the reference voltage VCM. This allows for matching the DC voltage level (common voltage) of the output voltage Vout from the DDA 21 with the reference voltage VCM. Thus, a failure that the DC voltage level of the output voltage Vout from the DDA 21 becomes unstable can be prevented and the impedance Z in the target 2 can be accurately measured.

Incidentally, in FIG. 2, the example where the DDA 21 including the first differential amplification circuit 23, second differential amplification circuit 24, and third differential amplification circuit 25 is included in the amplification circuit 4 is illustrated. As in FIG. 3, however, the first differential amplification circuit 23, second differential amplification circuit 24, and third differential amplification circuit 25 may be included in the amplification circuit 4 as separate parts.

In this manner, in the second embodiment, the AC voltage component included in the output voltage Vout from the amplification circuit 4 is removed by the low pass filter 22 and then is fed back to the input side of the amplification circuit 4. Therefore, it is possible to match the DC voltage level (common voltage) of the output voltage Vout from the amplification circuit 4 with the reference voltage VCM which is the DC voltage level of the input voltage Vin. As a result, the DC voltage level of the output voltage Vout from the amplification circuit 4 does not become unstable and thus the impedance Z in the target 2 can be accurately measured.

Third Embodiment

A third embodiment includes a more simplified configuration of an amplification circuit 4 than the second embodiment.

Figure 4:
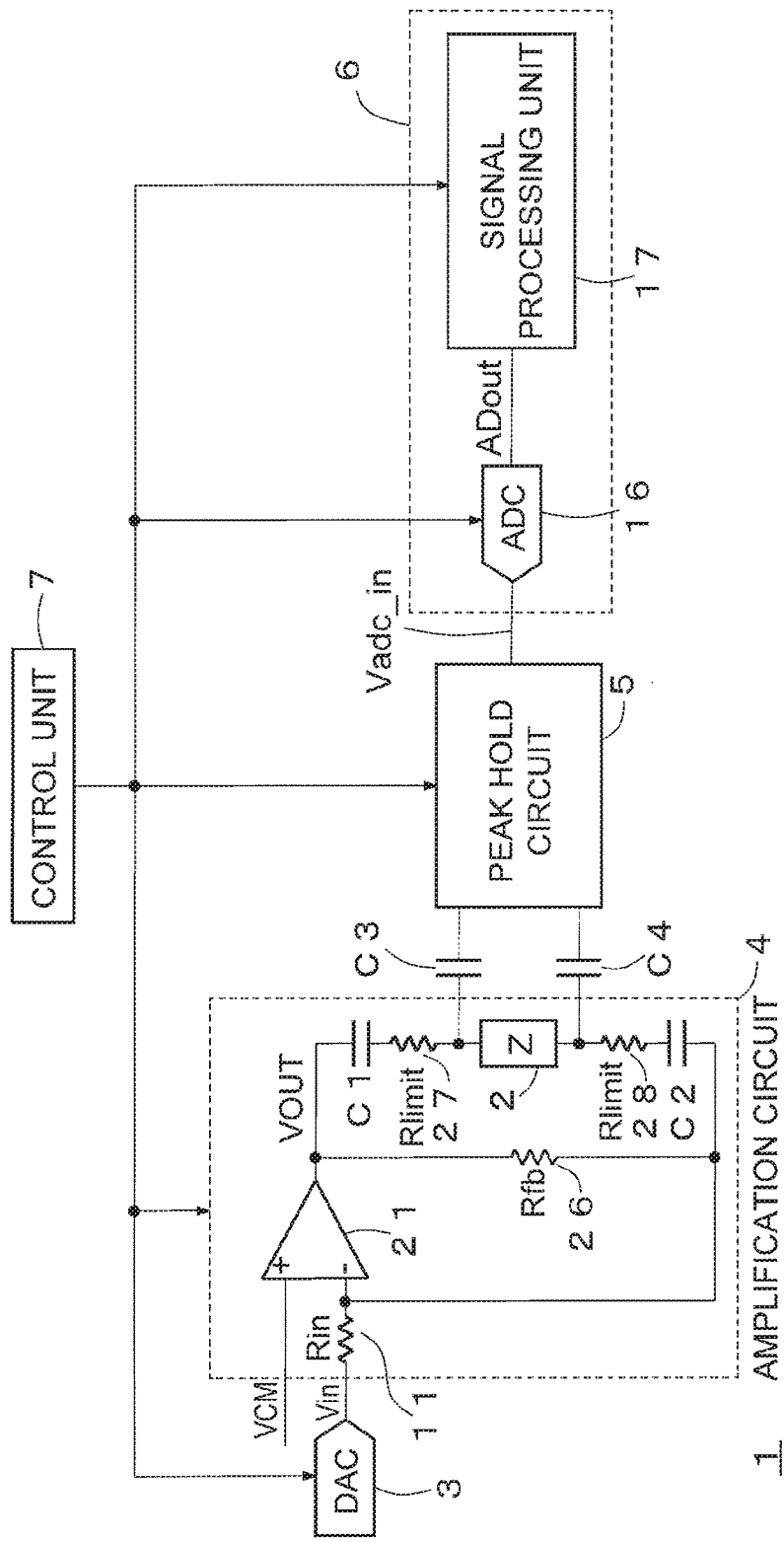
FIG. 4 is a block diagram illustrating a schematic configuration of an impedance measuring circuit according to a third embodiment.

FIG. 4 is a block diagram illustrating a schematic configuration of an impedance measuring circuit 1 according to a third embodiment. An amplification circuit 4 in an impedance measuring circuit 1 in FIG. 4 includes an amplifier 21 and a second resistor 26. One end of the second resistor 26 is connected to the output node of the amplifier 21 and another end of the second resistor 26 is connected to a connecting node of the first resistor 11 and the second capacitor C2. In FIG. 4, a resistance value of the second resistor 26 is defined as Rfb.

Including the second resistor 26 sets the DC voltage level of the output voltage from the amplifier 21 to a voltage corresponding to a voltage in the connecting node of the first resistor 11 and the second capacitor C2. Therefore, a failure that the output voltage Vout from the amplification circuit 4 becomes unstable can be prevented.

Incidentally, in FIG. 4, a third resistor 27 is connected between a target 2 and a first capacitor C1, and a fourth resistor 28 is connected between the target 2 and the second capacitor C2. The third resistor 27 and fourth resistor 28 are included mainly to limit an AC current upon failure. A resistance value Rlimit of the third resistor 27 and fourth resistor 28 is approximately 4.7 kΩ. Meanwhile, a capacitance of the first capacitor C1 and second capacitor C2 is approximately 470 nF.

Hereinafter, the impedance Z where the first capacitor C1, third resistor 27, target 2, fourth resistor 28, and fourth capacitor C4 connected in series are combined, is referred to as a total impedance Ztotal of the target 2.

A resistance value of the second resistor 26 is categorized as (1) and (2) below according to a magnitude to the total impedance Ztotal of the target 2.

(1) When Ztotal≤10 kΩ(≈4.7 kΩ×2) holds, the second resistor 26 is approximately 300 kΩ and is dependent on the third resistor 27 and fourth resistor 28.

(2) When Ztotal>10 kΩ holds, the second resistor 26 is Z×30 Ω or more and is dependent on Z.

As described above in (2), when the total impedance Ztotal of the target 2 is larger than 10 kΩ, it is desirable to set the resistance value Rfb of the second resistor 26 to more than or equal to 30 times the value Ztotal. Moreover, the resistance value Rfb of the second resistor 26 varies according to the impedance Z of the target 2.

Incidentally, the impedance Z in the first capacitor C1 and second capacitor C2 is negligible since the impedance Z is much smaller than the impedance Z in the target 2 or resistance values of the third and the fourth resistors 27 and 28 at a frequency of 1 kHz or more.

In this manner, in the third embodiment, the output node of the amplifier 21 is connected to one end of the second resistor 26 while the second resistor 26 is connected between the input node of the first resistor 11 and amplifier 21 and a connecting node of the second capacitor C2. Therefore, the DC voltage level in the output node of the amplification circuit 4 can be set even with a simpler circuit than that of the first embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. An impedance measuring circuit, comprising:
   an amplifier connected to a target and to amplify an input AC voltage with a gain corresponding to an impedance in the target and to output the voltage; and
   a voltage level setting circuit to set a DC voltage level in an output node of the amplifier when a first capacitor is connected between one end of the target and an output node of the amplifier and a second capacitor is connected between another end of the target and a node with a voltage correlated with the input AC voltage.

2. The impedance measuring circuit according to claim 1, comprising:
   a first resistor applied with the input AC voltage at one end thereof and connected to an input node of the amplifier at another end thereof,
   wherein the voltage correlated with the input AC voltage is output from the other end of the first resistor.

3. The impedance measuring circuit according to claim 1, wherein the voltage level setting circuit equalizes a DC voltage level at the output node of the amplifier to a DC voltage level of the input AC voltage.

4. The impedance measuring circuit according to claim 1, wherein the voltage level setting circuit feeds back a signal obtained by removing an AC component included in an output signal of the amplifier, to an input side of the amplifier.

5. The impedance measuring circuit according to claim 1, wherein the voltage level setting circuit comprises a filter to remove a frequency component of a predetermined frequency or more included in an output voltage from the amplifier, and
   the amplifier adjusts a gain of the input AC voltage based on an output voltage from the filter.

6. The impedance measuring circuit according to claim 5, wherein the predetermined frequency is a frequency lower than or equal to a frequency of the input AC voltage.

7. The impedance measuring circuit according to claim 6, wherein the amplifier comprises:
   a first differential amplification circuit to output a voltage corresponding to a voltage difference between the output voltage from the filter and a reference voltage which is a DC voltage level of the input AC voltage;
   a second differential amplification circuit to output a voltage corresponding to a voltage difference between the voltage correlated with the input AC voltage and the reference voltage; and
   a third differential amplification circuit to output, from the output node of the amplifier, a voltage corresponding to a voltage difference between an output voltage from the first differential amplification circuit and an output voltage from the second differential amplification circuit.

8. The impedance measuring circuit according to claim 7, wherein the amplifier is a differential difference amplifier comprising the first differential amplification circuit, the second differential amplification circuit, and the third differential amplification circuit.

9. The impedance measuring circuit according to claim 2, wherein the voltage level setting circuit comprises a second resistor connected between a connection node of the first resistor, the input node of the amplifier and the second capacitor and the output node of the amplifier.

10. The impedance measuring circuit according to claim 9, wherein a resistance value of the second resistor is set according to an impedance value of the target when a total impedance value of the target including a resistor connected in series to the target is larger than a predetermined value and is set to a fixed value when the total impedance value is less than or equal to the predetermined value.

11. The impedance measuring circuit according to claim 10, wherein a resistance value of the second resistor is more than or equal to thirty times the impedance value of the target when the total impedance value is larger than the predetermined value.

12. The impedance measuring circuit according to claim 1, comprising:
   a peak hold circuit to hold a peak value of a voltage signal between one end of the target and another end of the target to output a hold value; and
   an impedance calculation circuit to calculate the impedance of the target based on the hold value.

* * * * *